United States Patent [19]
Bryan et al.

[11] Patent Number: 5,625,636
[45] Date of Patent: Apr. 29, 1997

[54] INTEGRATION OF PHOTOACTIVE AND ELECTROACTIVE COMPONENTS WITH VERTICAL CAVITY SURFACE EMITTING LASERS

[76] Inventors: Robert P. Bryan, 12700 Indian School Rd. NE., Apt. 604, Albuquerque, N.M. 87112; Peter Esherick, 1105 Sagebrush Trail SE., Albuquerque, N.M. 87123; Jack L. Jewell, 12 Timberline Dr., Bridgewater, N.J. 08807; Kevin L. Lear, 13713 Vic Rd. NE., Albuquerque, N.M. 87112; Gregory R. Olbright, 3875 Orange Ct., Boulder, Colo. 80304

[21] Appl. No.: 774,915

[22] Filed: Oct. 11, 1991

[51] Int. Cl.$^6$ .................................. H01S 3/19; H01S 3/10
[52] U.S. Cl. .................................. 372/50; 372/45; 372/46; 372/92
[58] Field of Search .................................. 372/50, 45, 46, 372/92, 38

[56] References Cited

U.S. PATENT DOCUMENTS

| | | | |
|---|---|---|---|
| 4,806,997 | 2/1989 | Simmons et al. | 357/16 |
| 4,829,357 | 5/1989 | Kasahara | 357/38 |
| 4,833,511 | 5/1989 | Sugimoto | 357/19 |
| 4,864,168 | 9/1989 | Kasahara et al. | 307/631 |
| 4,879,250 | 11/1989 | Chan | 437/3 |

(List continued on next page.)

OTHER PUBLICATIONS

S. Lin et al., "Integration of High–Gain Double Heterojunction GaAs Bipolar Transistors with a LED for Optical Neutral Network Application," *IEEE/Cornell Conference On Advanced Concepts in High Speed Semiconductor Devices and Circuits*, Apr. 1989, pp. 344–352.

J. Campbell, "Phototransistors for Lightwave Communications" *Semiconductors and Semimetals*, vol. 22, Part D, 1985, pp. 389–447 (No Month).

J. Jewell et al., "Low–Threshold Electrically Pumped Vertical–Cavity Surface–Emitting Microlasers," *Electronics Letters*, vol. 25, No. 17, Aug. 17, 1989, pp. 1123–1124.

H. Beneking et al., "GaAs–Ga AlAs Phototransistor/Laser Light Amplifier," *Electronics Letters*, Jul. 17, 1980, vol. 16, No. 15, pp. 602–603.

H. Beneking, "Full Solid State Image Converter Based On Integration of Phototransistors and LEDs," *IEEE Electron device Letters*, vol. EDL-2, No. 4, Apr. 4, 1981, pp. 99–100.

A. Sasaki et al., "In GaAsP–InP Heterojunction Phototransistors and Light Amplifiers," *Japanese Journal of Applied Physics*, vol. 20, No. 4, Apr. 1981, pp. L283–L286.

G. Taylor et al., "A New Double Heterostructure Optoelectronic Switch Device Using Molecular Beam Epitaxy," *Journal of Applied Physics*, vol. 59, No. 2, Jan. 15, 1986, pp. 596–600.

K. Kasahara et al., "Double Heterostructure Optoelectronic Switch as a Dynamic Memory with Low–Power Consumption." *Applied Physics Letters*, vol. 52, No. 9, Feb. 29, 1988, pp. 679–681.

Y. Tashiro et al., "Vertical To Surface Transmission Electrophotonic Device With Selectable Ouput Light Channels," *Applied Physics Letters*, vol. 54, No. 4, Jan. 23, 1989, pp. 329–331.

G.R. Olbright et al, "Cascadable Laser Logic Devices: Discrete Integration of Phototransistors With Surface–Emitting Laser Diodes", *Electronics Letters*, vol. 27, No. 3, Jan. 31, 1991 pp. 216–217.

*Primary Examiner*—James W. Davie
*Attorney, Agent, or Firm*—Karuna Ojanen; Gregory A. Cone

[57] ABSTRACT

A monolithically integrated optoelectronic device is provided which integrates a vertical cavity surface emitting laser and either a photosensitive or an electrosensitive device either as input or output to the vertical cavity surface emitting laser either in parallel or series connection. Both vertical and side-by-side arrangements are disclosed, and optical and electronic feedback means are provided. Arrays of these devices can be configured to enable optical computing and neural network applications.

60 Claims, 6 Drawing Sheets

U.S. PATENT DOCUMENTS

| | | | |
|---|---|---|---|
| 4,888,625 | 12/1989 | Mueller | 357/17 |
| 4,891,093 | 1/1990 | Smith | 156/613 |
| 4,910,571 | 3/1990 | Kasahara et al. | 357/30 |
| 4,947,400 | 8/1990 | Dutta | 312/50 |
| 4,991,179 | 2/1991 | Deppe et al. | 372/92 |
| 5,028,969 | 7/1991 | Kasahara et al. | 357/19 |
| 5,132,982 | 7/1992 | Chan et al. | 372/45 |
| 5,136,603 | 8/1992 | Hasnain et al. | 372/50 |

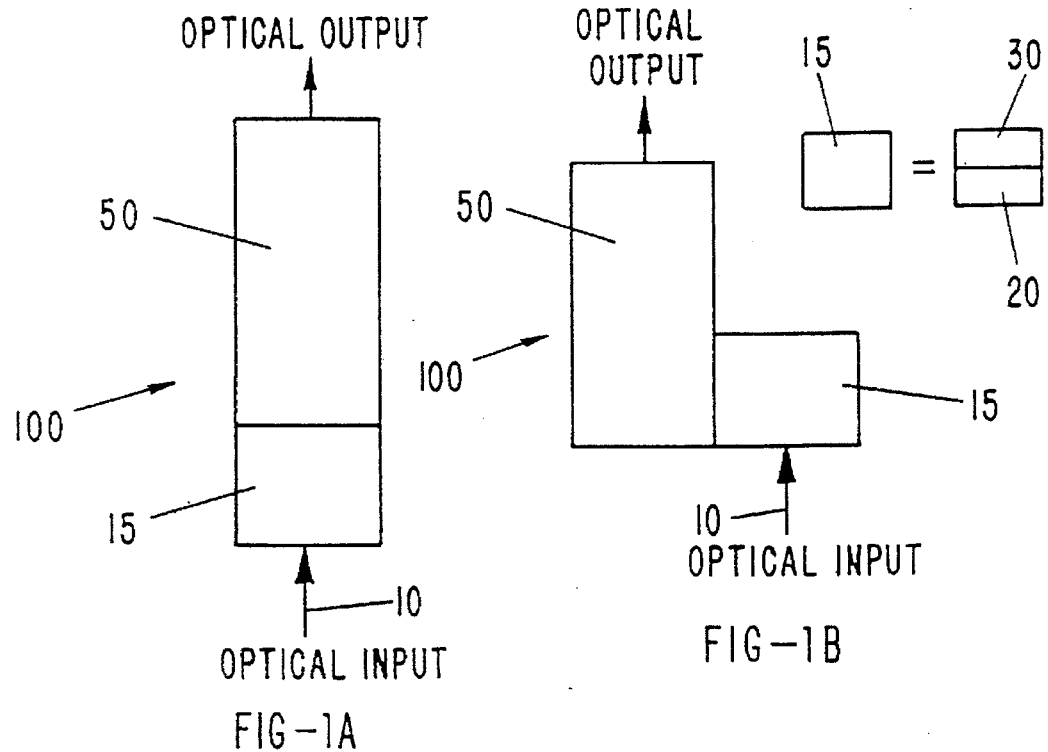
FIG-1A
FIG-1B
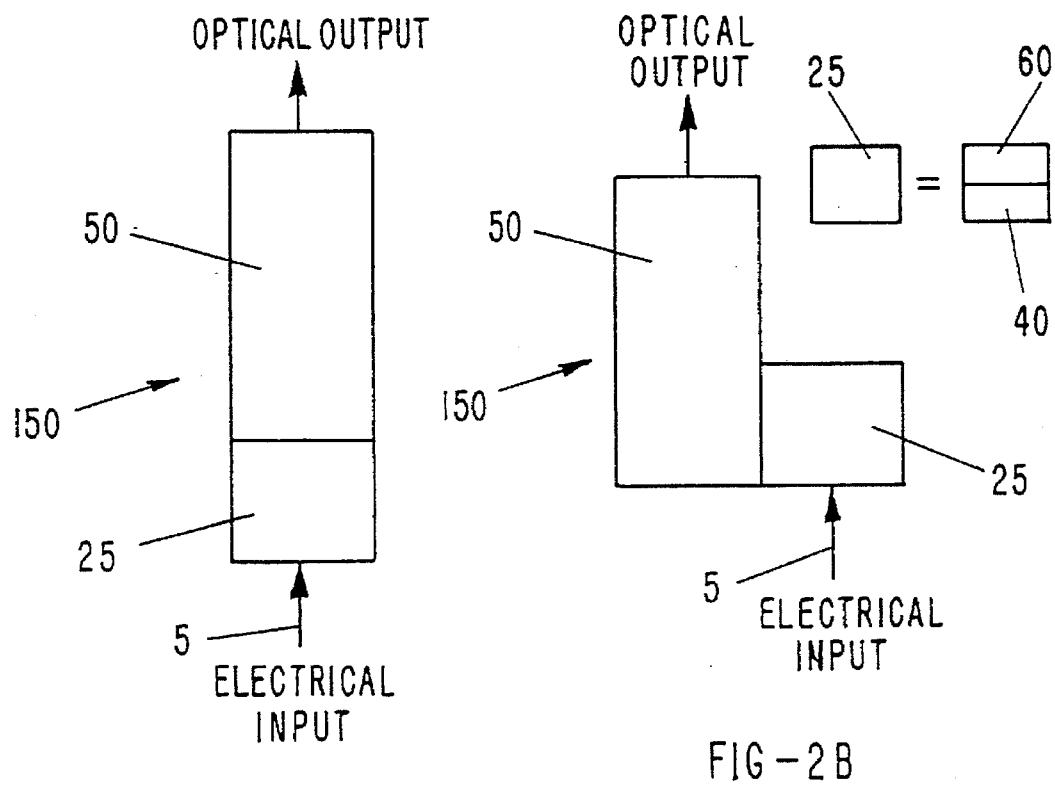
FIG-2A
FIG-2B

INTEGRATION OF PHOTOACTIVE AND ELECTROACTIVE COMPONENTS WITH VERTICAL CAVITY SURFACE EMITTING LASERS

The United States Government has rights in this invention pursuant to Contract No. DE-AC04-76DPO0789 between the Department of Energy and American Telephone & Telegraph Company.

BACKGROUND OF THE INVENTION

This invention relates generally to the field of integrated optoelectronics, and more particularly, to a vertical cavity surface emitting lair integrated with electrically or optically sensitive interactive components, such as a photodetector, a transistor, or diode. One embodiment of the invention is an optical-input/optical-output device in either a vertical or side-by-side geometry suitable for use in one- and two-dimensional arrays and as individual elements in optoelectronic integrated circuits (OEICS). Another embodiment of the invention is an electrical-input/optical output device in either a vertical or side-by-side geometry suitable for use in one- and two-dimensional arrays.

Devices integrating photodetector and photoemitting components with light-emitting components are known, and the following references discuss multilayer devices or combinations of devices that receive optical inputs, convert them to electrical signals, and then use the electrical signal to cause light emission. These particular devices are prone to latch-up, that is, although the devices can be turned on with a light pulse, they can't be turned off without significantly decreasing the electrical current flowing through the device because of either optical or electrical excessive positive feedback. This is viewed as a disadvantage for a system where all signals are optical. Photodiodes are inefficient in converting electrical power to optical power and are not as directional as lairs. Edge-emitting lasers are not readily fabricated into two-dimensional arrays.

The reference of Beneking, H., GaAs-GaAlAs phototransistor/laser light amplifier, ELECTRON. LETT. 16(15): 602–603, 1980 July 17, discusses the integration of phototransistors on top of edge-emitting lasers tier use as a light amplifier. Beneking, H. Full Solid State Image Converter Based on Integration of Phototransistors and light-emitting diodes, ELEC. DEV. LETT. EDL-2(4): 99–100, 1981 April 4, discusses arrays of phototransistors and light-emitting diodes one on top of the other for purposes of converting an image from one wavelength to another.

Sasaki, A. and M. Kuzuhara, in GaAsP-InP Heterojunction Phototransistors and Light Amplifiers, JAPAN J. OF APPL. PHYS. 20(4): L283–L286, 1981 April discusses the vertical integration of a phototransistor and a light-emitting diode. Although the configuration disclosed prevents electrical feedback to avoid latching operation, it does not discuss optical feedback which would indeed cause the device to latch.

Taylor, G. W., J. G. Simmons, A. Y. Cho and R. S. Mand, A new double heterostructure optoelectronic switching device using molecular beam epitaxy, J. APPL. PHYS. 59(2): 596–600, 1986 Jan 15, discusses a multilayer device closely related to p-n-p-n structures such as thyristors to be used for optical logic and memory. In some ways these devices can be thought of as an light-emitting diode (p-n junction) placed next to a phototransistor, a n-p-n device, but if these devices are connected in such a way that both electrons and holes flow between them, they latch-up when turned on. Taylor also specifically mentions that while his devices emit spontaneous emission, like that from light-emitting diodes, they could be made to lase (stimulated emission) by configuring the layers in a cavity. The reference, however, does not provide the teaching for the implementation of either the edge-emitting or the vertical cavity surface emitting type lasers.

Kasahara, K., Y. Tashiro, N. Hamao, M. Sugimoto and T. Yanase, Double heterostructure optoelectronic switch as a dynamic memory with low-power consumption, APPL. PHYS. LETT. 52(9): 679–681, 1988 Feb 29, addresses making electrical contacts to interior layers of a p-n-p-n device like Taylor's above, in order to improve the electrical switching speed and increase flexibility.

Tashiro, Y., N. Hamao, M. Sugimoto, N. Takado, S. Asada, K. Kasahara and T. Yanase, Vertical to surface transmission electrophotonic device with selectable output light channels, APPL. PHYS. LETT. 54(4): 329–331, 1989 Jan 23, discusses a p-n-p-n layered device formed into an edge-emitting laser with multiple outputs. It also presents laser emission out of the surface of the wafer by turning the emission from the edge of lasers using integral 45° mirrors. This approach has the disadvantage of requiting more surface area on the wafer and requiring vertical facets formed either by cleaving or sophisticated dry etching techniques.

Lin, S. H., J. H. Kim, J. Katz and D. Psaltis, integration of high-gain double heterojunction GaAs bipolar transistors with a light-emitting diode for optical neural network application, IEEE/CORNELL CONFERENCE ON ADVANCED CONCEPTS IN HIGH SPEED SEMICONDUCTOR DEVICES AND CIRCUITS, 344–352, 1989, addresses integrating multiple transistors and phototransistors with light-emitting diodes in arrays for neural network applications. The devices are laid out side-by-side which is required for the multiple electrical connections when more than one transistor is used to drive the light-emitting diode.

U.S. Pat. No. 4,891,093, entitled "Processes For the Manufacture of Laser Including Monolithically Integrated Planar Devices," to Smith, Jan. 2, 1990, discloses a method and a structure suitable for monolithic integration of an edge-emitting laser and another device, e.g. a field-effect transistor in a laterally offset planar region. Although Smith discloses a laser monolithically integrated with other devices capable of driving the laser, the actual laser used is an edge-emitting laser. The method disclosed in Smith '093, moreover, is most applicable to planar devices requiring low doping concentrations, e.g. the field-effect transistor, and the devices are positioned laterally.

U.S. Pat. No. 4,910,571, entitled "Optical Semiconductor Device," Kasahara et al., Mar. 20, 1990, teaches an optical semiconductor device for receiving and emitting light at laterally separated points to facilitate alignment of light axes for multiple inputs or outputs. Although the device disclosed in the patent reference has optical inputs and optical outputs, and uses layers of semiconductor materials that have an overall doping structure of p-n-p-n, its purpose is to provide a plurality of laterally separated regions of light reception and emission, instead of a single receiving and single outputting region that are laterally coincident. The device of Kasahara '571 requires that the light inputs and outputs be on the same side of the substrate and produces optical output from a light-emitting diode, which is an incoherent light source. The device of Kasahara '571 latches so that it emits light even after the input light is removed until the electrical supply is removed.

U.S. Pat. No. 4,879,250, entitled "Method of Making a Monolithic Interleaved light-emitting diode/PIN Photodetector Array," to Chan, Nov. 7, 1989 discloses arrays of different types photoelectric devices (e.g. photodiodes and light-emitting diodes) fabricated from the same epitaxial layers, but these arrays have light inputs and outputs on the same side of the substrate. The photodiodes provide no electrical gain, are inefficient in electronic to optical conversion, and are not as directional as lasers.

U.S. Pat. No. 4,833,511, entitled "Phototransistor Device," to Sugimoto, May 23, 1989, discloses an optically controllable device where the level of the input signal changes the absorption in the device and hence the amount of transmitted light. The device of Sugimoto '511 controls optical output signals with optical input signals, and uses optical signal paths perpendicular to the substrate, and use phototransistors to amplify the current generated by low levels of input signal. Sugimoto's device, however, contains no emitting element for converting electrical signals into optical signals. The light output is always smaller than the light input because the output is just the unabsorbed portion of the input. Moreover, the device has as an object of its design a bistable or hysteretic behavior.

U.S. Pat. No. 4,888,625, entitled "Optoelectronic Coupling Element, and Method of Making Same," to Mueller, Dec. 19, 1989 discloses an optocoupler of solid construction formed by affixing a chip of light emitting elements to one side of an optic coupling medium and a chip of light detecting elements to the other. The light emitting elements are intended to direct their light output to the light detecting elements attached to the same piece of optic coupling medium. It takes an electrical input, converts it to light which passes through the optic coupling medium to a detector which converts the light to electricity. While the device of Mueller '625 uses light emitting and detecting elements which direct their light perpendicular to the plane of the devices, and uses stacked geometries with the two elements at the same lateral point, its purpose is to convert an input electrical signal to an output electrical signal using elements that are optically connected, rather than acting upon an input signal to produce an output optical signal using elements that are electrically connected.

U.S. Pat. No. 4,947,400, entitled "Laser-Photodetector Assemblage," to Dutta, Aug. 7, 1990, discloses a monolithic integration of an edge-emitting laser and a phototransistor situated side-by-side so that the phototransistor responds to light leaking out of the laser. The electrical signal from the phototransistor is used as a monitor of the laser power. The use of the phototransistor, in Dutta '400, is to sense the output of a laser, rather than to control the lair. The geometry of these devices is also a side-by-side arrangement.

The operation of the heterojunction phototransistor as an individual component has been described in the literature, see e.g., J. C. Campbell, Phototransistors for Lightwave Communication, in SEMICONDUCTORS AND SEMIMETALS, Vol. 22, Part 2, pp. 389–447 (1985); and the operation of the vertical cavity surface emitting laser as an individual component was described in Jewell. J. L. et al., Low-Threshold Electrically Pumped Vertical-Cavity Surface-Emitting Microlasers, ELECT. LETT., Vol. 25, No. 17, Aug. 17, 1989, pp. 1123–1124.

It is thus an object of the invention to provide an optical inputs/optical outputs or electrical inputs/optical outputs device suitable for use in arrays, and as individual elements in optoelectronic integrated circuits. This object is achieved by the integration of a photodetector, transistor, diode, or other photo- or electro-active components with a vertical cavity surface emitting laser in a either a vertical or a side-by-side arrangement. The vertical and the side-by-side geometry provides for small, compact, and densely-spaced arrays and individual elements in optoelectronic integrated circuits (OEICS) which enable, for example, optoelectronic interconnects, laser-scanning printing and projection, optical communication, neural networks, and optical computing. Additionally, the geometry simplifies the required electrical contacts between the components.

It is yet another object of the invention to provide an integrated optoelectronic device with high optical gain. In the photodetector/vertical cavity surface emitting laser embodiment, this object is achieved by either using a photodetector with intrinsic electronic gain, such as a phototransistor, or by using a photodetector such as a PIN photodiode in combination with a separate component, such as an electronic amplifier. The vertical cavity surface emitting laser further contributes to the increased optical gain by having efficient electronic-to-photonic conversion and lasing action. The mulitmilliwatt optical output of the vertical cavity surface emitting laser advantageously enables a fan-out capability because the light can be split and redirected. In addition, cascadability can be achieved if the output of the vertical cavity surface emitting laser or the output interactive component drives a similar but separate device. Cascadability facilitates optical computing and neural networks. Additional advantages achieved by the particular components is that the device is less sensitive to small fluctuations in power, and the device is much faster because more power is available to drive the next device.

Yet, still another object of the invention to provide a fundamental optical device characterized by high contrast and stability. High contrast is the ratio of the maximum optical output power of the device turned on to the power of the light emitted when the device is just below threshold for turn on. The feature of the invention that achieves this object is that the vertical cavity surface emitting laser has a threshold current, and the nonlinear response of the vertical cavity surface emitting laser to current input. In addition, an interactive component such as a phototransistor, may be designed for a nonlinear response. These features of the invention enable compatibility with digital or sigmoidal (smooth) switching applications. Moreover, the device is less susceptible to noise or fluctuations in the supply voltage, or in optical or electronic fluctuations in individual components of the device. Specific applications requiring a non-linear response, such as neural network and sigmoidal switching applications, are also available.

It is yet another object of the invention to provide an optoelectronic device with controlled optical and electrical feedback and/or input/output isolation. One way to control the optical feedback within the vertical cavity surface emitting laser is to design the mirrors within the lair to have specific reflectivities to obtain optically non-hysteretic, hysteretic, or latching capabilities which will be discussed in further detail. Additionally, an absorbing layer or absorbing mirrors can be placed between the vertical cavity surface emitting laser and the photoactive element. To minimize optical feedback when the interactive component is a phototransistor, the two optical devices may be made to be sensitive to different wavelengths or placed side-by-side so that the optical output of the vertical cavity surface emitting laser does not intersect the photo interactive component. Electrical feedback is provided by a semiconductor layer between the vertical cavity surface emitting laser and the interactive component to prevent minority carrier transport. In an array, complete electronic isolation between the individual devices controls electrical feedback. Advantages realized by these structural features of the invention is that the device may be turned on or off only with optical signals, rather than reversing or stopping the flow of current, thereby facilitating optical computing. Because the device can be designed to have no latching, the device has faster response time because it does not have to overcome positive feedback when switching on and off. Moreover, the device can be designed to adjust the feedback to control variable hysteresis. Arrays using these devices can also be configured as latching devices by allowing optical feedback from the vertical cavity surface-emitting laser to be absorbed in, for example, the base/collector regions of a heterojunction phototransistor or by replacing the heterojunction phototransistor by a thyristor or photodetector/electronic amplifier combination in which case they would function as image memories capable of capturing and storing a two-dimensional image until the array is reset.

Still another object of an embodiment of the invention is to be able to control the wavelengths of the optical signal compared to the wavelength of the output optical signal. When the interactive component is a heterojunction phototransistor, the device can be designed so that the heterojunction phototransistor is sensitive to a wavelength other than that emitted by the vertical cavity surface emitting laser. Moreover, within the heterojunction phototransistor, the bandgaps of the emitter, base, and collector can be adjusted to control the wavelength range over which the phototransistor may be photoactivated. Those features of the surface emitting laser that can be used to control the wavelength of the device include adjusting the bandgap of the laser and adjusting the length of the laser cavity.

It is still another advantage to provide a fundamental optical device suitable for fabrication into large arrays of similar elements in a configuration compatible with parallel optical signal processing. Other advantages achieved are that the device array may be readily fabricated with microfabrication technology, be microscopic in size, and be integrable with other optoelectronic components without being adversely affected by feedback.

Still another object of the invention is to provide an optoelectronic device having an electrical input/optical output. This objective is achieved by the integration of an electroactive component, such as a transistor or dime or other current or voltage controlled components with a vertical cavity surface emitting laser. In particular, both field effect transistors (voltage controlled) and bipolar transistors (current controlled) are examples of such transistors. This vertical or side-by-side geometry provides for an electrical input/optical output component suitable as a building block upon which to build OEICS such as optoelectronic interconnects for computing, electrically driven vertical cavity surface emitting laser arrays for laser-printing, -scanning, and -projection.

BRIEF DESCRIPTION OF THE DRAWINGS

FIGS. 1a and 1b illustrate the integration of a photosensitive interactive component with the vertical cavity surface emitting laser in a vertically-stacked and a side-by-side arrangement, respectively.

FIG. 2a and 2b illustrate the integration of an electrosensitive interactive component with the vertical cavity surface emitting laser in a vertical and a side-by-side arrangement, respectively.

DESCRIPTION OF THE INVENTION

Figure 3:
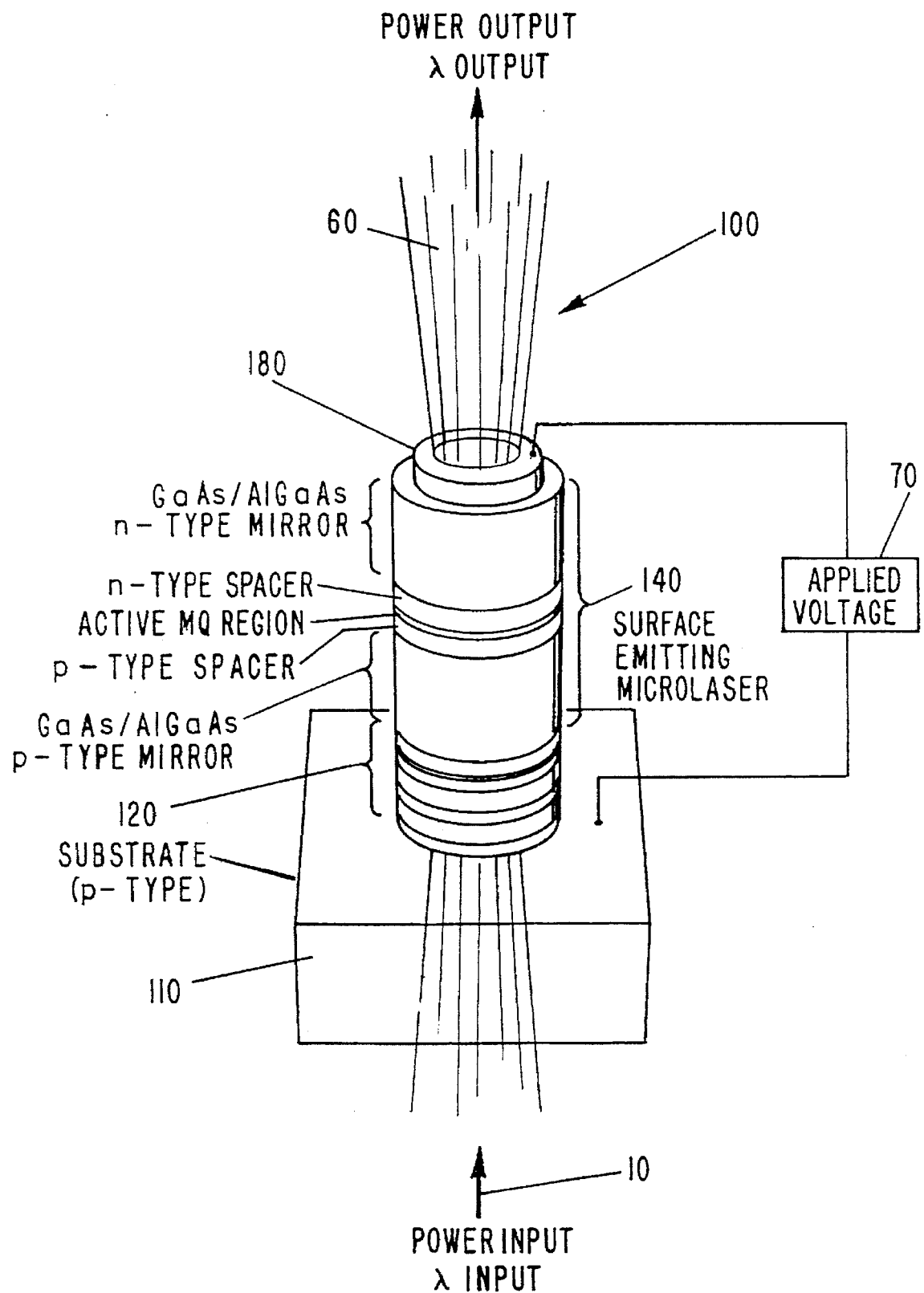
FIG. 3 illustrates the integration of a heterojunction phototransistor and the vertical cavity surface emitting laser as an embodiment of the invention.

The invention comprises a vertical cavity surface emitting laser integrated with microfabrication technology with another component capable of interacting either electronically or optically with the vertical cavity surface emitting laser. Thus, the other interactive component may either provide an electrical input into the vertical cavity surface emitting laser or it may be responsive to the optical output of the vertical cavity surface emitting laser. It is preferred that the interactive component and the vertical cavity surface emitting laser be aligned in a vertical geometry; vertical meaning parallel to the direction of light emitted from the vertical cavity surface emitting laser. Integrated in the context of this patent application shall mean the individual components are manufactured within and on the substrate which serves not only as a support for the components, but also as the material from which the components are made - and even, to some extent, the interconnection medium. Thus, a suitable substrate is one that provides physical support for the layers to be grown on top of it and one capable of providing either electrical conduction or insulation, depending upon the application. The layers of the device may be grown by means such as molecular beam epitaxy or by metallo-organic chemical vapor deposition on a substrate, such as indium phosphide, or gallium arsenide, or silicon. Both the layers and the substrates may be either these materials or other elemental or Group III/V or Group II/VI combinations including alloys. Sapphire, quartz, or diamond are also suitable substrates. The substrate, moreover, may be either transparent to the optical input/output or be easily removable from the region intercepting the light path if the substrate is opaque.

A vertical cavity surface emitting laser within the context of this invention is a device that emits laser light perpendicular to the layer or layers comprising it. For example, a typical vertical cavity surface emitting laser is made from multiple semiconductor layers grown by molecular beam epitaxy or organometallic vapor phase epitaxy, and usually comprises three functional components: a first mirror; a second mirror, both mirrors defining the extent of the laser; and a laser cavity interposed between the mirrors. In general, the mirrors are made from repetitive layers having relatively high and low indices of refraction so that constructive optical interference occurs in the laser cavity at the lasing wavelength resulting in light amplification through stimulated electromagnetic radiation within the laser. The mirrors are distributed Bragg reflectors. The mirror may have different reflectivities in order to couple the majority of the light out of the laser in one direction. The laser cavity of the exemplary vertical cavity surface emitting laser uses a p-n junction to inject carriers that recombine radiatively to emit light. Quantum wells may also be incorporated into the laser to control the operating wavelength and improve the optical quantum efficiency of the laser.

The vertical cavity surface emitting laser is further characterized by advantages over other lightemitting devices. In contrast to a light-emitting diode, the vertical cavity surface emitting laser has a brighter more directed output and a narrower spectral bandwidth. In addition, customizing the mirror layers of the vertical cavity surface emitting laser can ensure that the majority of light emerges from a selected surface, whereas with a light-emitting diode the output light is equally directed to both surfaces or layers of the device. The vertical cavity surface emitting laser is also preferred over an edge-emitting laser because the vertical cavity surface emitting laser has the potential for lower current threshold enabling lower power operation. Low power operation is especially desirable when the invention is incorporated into arrays where power dissipation becomes a critical operation factor. The vertical cavity surface emitting laser is also more suitable for dense integration into an array than the edge-emitting laser because there is no need to form optical-quality etched surfaces in the wafer for surface emitting directional emission of light as required with the edge-emitting laser. Moreover, the vertical cavity surface emitting laser is compatible with and conducive to standard planar microfabrication techniques, including photolithography. The vertical geometry of the vertical cavity surface emitting lair also supports its use in one and two dimensional arrays, and facilitates stacking or otherwise interconnecting these arrays for optical computing or other applications. More specifically, the fact that the direction of light propagation is perpendicular to the layers, and thus to the plane of the devices in an array, light can easily be propagated between arrays of the devices or in an optical system.

FIGS. 1a and 1b illustrate the use of the electrical or optical sensitive interactive component with the vertical cavity surface emitting laser. The substrate is not shown in the figures, but one skilled in the art will appreciate that the substrate can be located at the top or the bottom of the device. In FIG. 1a, the integrated device 100 comprises an interactive component 15 to provide an electronic signal into the vertical cavity surface emitting laser 50. It is contemplated that the electronic signal may be derived either from optical input/electrical output device, such as a photodiode or a phototransistor, or that the interactive component 15 be reactive only to an electronic signal. FIG. 1b illustrates the configuration where the interactive component 15 is reactive to the optical input of the vertical cavity surface emitting laser 50. In this instance, the output of the interactive component 15 may be electronic or optical, but it must be responsive to an optical input.

Referring now to FIG. 2a, the interactive component 15 may be, for example, a photodetector to produce an electrical signal in response to an incident optical signal 10. The amplifier 30 increases the voltage, current, or power of the electrical signal generated by the photodetector 20 to a level sufficient to drive the light-emitting component 50. The amplifier 30 may be an inherent part of the photodetector. Typically, the photodetector component 20 is a photodrive, i.e., a photodetector with inherent electrical gain such as a phototransistor, photothyristor, or avalanche photodiode. The phototransistor is a excellent choice because it provides light detection and electron amplification in the same device. The optically sensitive interactive component 15 may be vertically stacked or stacked side-by-side as in FIG. 2a.

Referring now to FIG. 2b the electrically sensitive interactive component 15 may be, for example, a transistor or diode, to produce an electrical signal in response to incident electrical voltage or current signals 10. As in FIG. 2a, the amplifier of the electrically sensitive interactive component 15 increases the voltage or current, or power of the electrical signal generated by the electrical receiver 20 to a level sufficient to drive the vertical cavity surface emitting laser 50. The amplifier 30 may be an inherent part of the electrical receiver 20. Typically the electrically sensitive interactive component 20 is a voltage or current controlled current drive such as a field-effect-transistor or bipolar transistor or a combination of diodes, resistors, capacitors, and transistors. The field-effect and bipolar transistors are excellent choices because they provide sufficient several milliamp current outputs to drive the vertical cavity surface emitting lasers for a few volts or tens of microamps inputs, respectively and as such are compatible with TTL, CMOS, ECL, and SFCL electrical signal levels. The electrically sensitive interactive component 15 may be vertically stacked or stacked side-by-side as shown in FIG. 2b.

The layers for either the interactive component or the vertical cavity surface emitting laser may be grown first, and the electrical connection between the components would be achieved by having layers of the same doping type in direct contact or by having metallic interconnections between layers having the same or opposite doping type. Electrical power 70 may be provided by impressing a voltage across a photodetector 120 and vertical cavity surface-emitting laser 140 in series through ohmic contacts to the substrate 110 and the top epitaxial layers 180. The contacts must not obscure the received or emitted optical signals. The ohmic contacts may be transparent and may be metal, such as gold, because they must be conductive. The metal may often be cut away from the light path from the photoemitter or photodetector because the metal contact may be so thick that it is opaque.

A preferred embodiment of the invention is shown in FIG. 3 and shall herein be described as a cascadable optical switch based on the integration of a heterojunction phototransistor 120 with a vertical cavity surface emitting laser 140. This integrated device 100 has a high optical gain, a factor of >20 overall, >200 differential, with the discrete but integrable components connected in series. These devices are ideally suited for parallel optical signal processing which has been severely hampered by the lack of several basic building blocks such as optical switching devices that exhibit low-switching energy, high optical gain to achieve fan-out capability, cascadability, and high contrast. This device is also easy to fabricate using self-aligned planar or non-planar semiconductor processing technology; the device is microscopic in size; the device is readily integrable with other optoelectronic components without being adversely affected by external optical feedback; the device is tolerant to temperature variations; and the device require a minimum number of components.

Never before have vertical cavity surface emitting lasers and heterojunction phototransistors, bipolar transistors, field-effect transistors, or diodes been properly scaled or integrated for the hybrid operation of a pair. In the operation of the integrated device, incident light, voltage, or current generates a current in the electrical or optical sensitive interactive component which is internally amplified and then used to drive the vertical cavity surface emitting laser above threshold. Therefore each component acts as an independent thresholding optical amplifier.

For optical input/optical output devices the optical-electrical-optical conversion results in a robust high-gain device in which the input optical beam is unaffected by external optical feedback. Because of the large absorption bandwidth of the heterojunction phototransistor 120, the device is able to convert beams from one wavelength to another. They can also convert incoherent light to coherent light, and these capabilities will be discussed further. The high-gain optical device is both cascadable and insensitive to feedback, with a light actuated current switching capability of a high-gain AlGaAs/GaAs heterojunction phototransistor and a low-threshold, high-power AlGaAs/GaAs vertical cavity surface emitting laser. The n-p-n heterojunction phototransistor, which is preferred over the p-n-p heterojunction phototransistor shown in FIG. 3, is grown by molecular beam epitaxy, consists of a wide-band-gap $Al_{0.35}Ga_{0.65}As$ emitter (3000 Å, n=1×10$^{17}$ cm$^{-3}$) and narrow-band-gap GaAs base (2350 Å, p=1×10$^{18}$ cm$^{-3}$), collector (3000 Å, n=1×10$^{16}$ cm$^{-3}$), and sub-collector (1670 Å, n=1×10$^{18}$ cm$^{-3}$) regions. Specific doping concentrations and types are chosen to optimize performance in terms of gain, speed, power dissipation, and other relevant parameters; those values presented are examples only and are not to be construed as preferred doping types or concentrations. The wide-band-gap emitter inhibits the base-to-emitter hole injection current and significantly increases the heterojunction phototransistor gain. The heterojunction phototransistor is electrically isolated using shallow proton implants. We employed a bi-layer structure consisting of a layer of electroplated gold covering a layer of photoresist as an ion blocking mask and also as a lift-off mask to form self-aligned electrical contacts. The input apertures of the heterojunction phototransistors have 15 µm diameters and the implant-defined device size is 40×40 µm. The phototransistor common-emitter, floating-base characteristic exhibits 10 mA photogenerated current for 120 µW of absorbed light power (176 µW incident) at 800 nanometers.

The molecular beam epitaxy grown vertical cavity surface emitting laser comprises a twenty period p-type AlAs/$Al_{0.15}Ga_{0.85}As$ distributed Bragg reflector, a four quantum-well (100 Å) GaAs/$Al_{0.3}Ga_{0.7}As$ active region and a 27.5 period n-type $Al_{0.15}Ga_{0.85}As$/AlAs distributed Bragg reflector. The vertical cavity surface emitting laser are electrically isolated in a manner similar to that used for the heterojunction phototransistors, by using deep-proton implants with 15-µm-diameter implant masks and self-aligned contacts. The continuous wave room-temperature laser L-I characteristic exhibits 2.5 mW laser-light output power at 850 nanometers for 10 mA injection current and is therefore ideally suited for integration with the ion-implanted heterojunction phototransistor.

Figure 4:
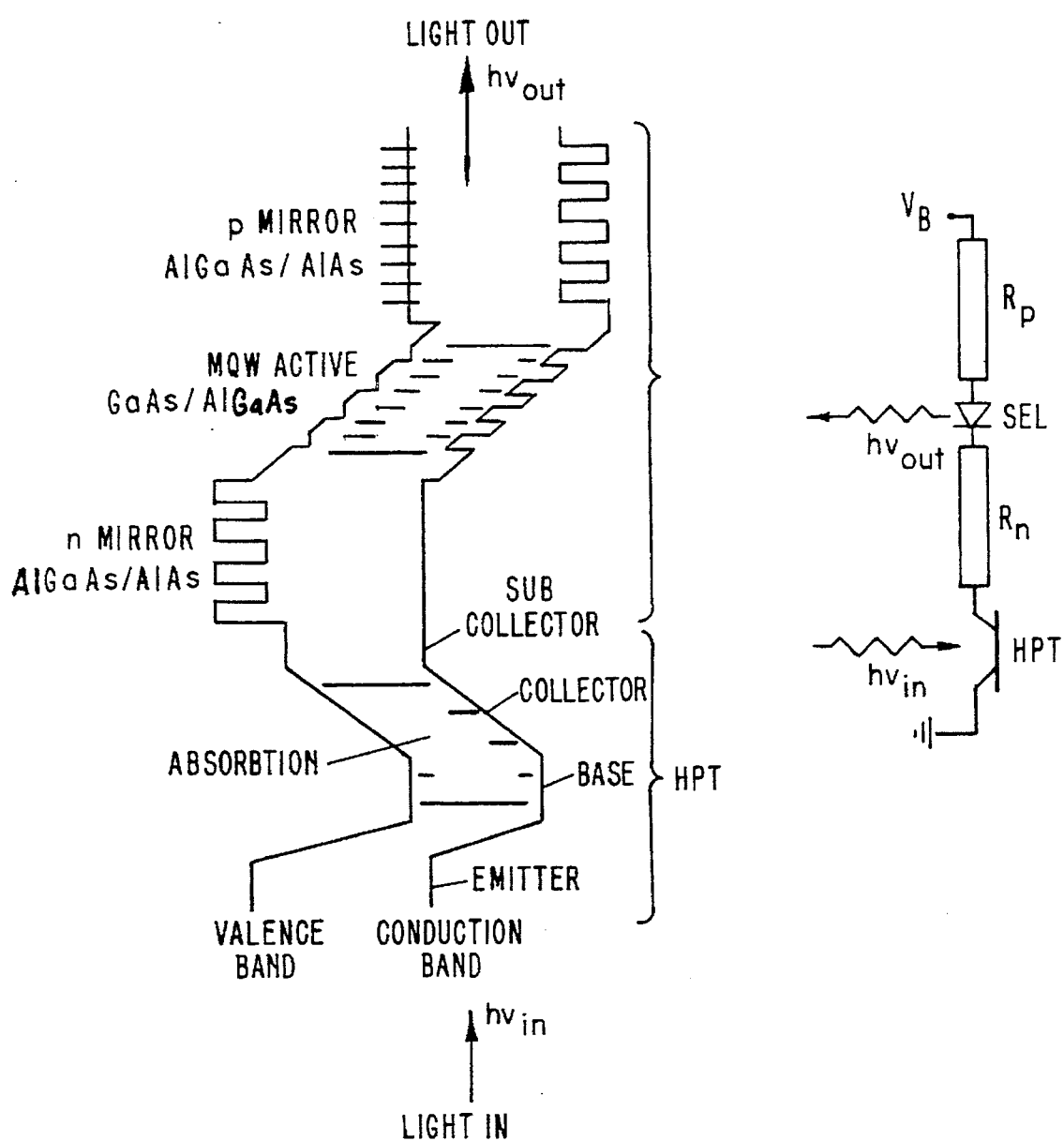
FIG. 4 is the calculated energy-band diagram of the device integrating a heterojunction phototransistor and the vertical cavity surface emitting laser, and shows an equivalent circuit of the integrated device.

In FIG. 4, the calculated energy diagram and the equivalent circuit for an integrated device is shown. The energy diagram is to scale with the exception that the 4-QW active region is expanded five times. Only the lowest-energy conduction band is shown. $R_n$ and $R_p$ refer to the series resistance of the n-type and p-type mirrors, respectively.

Figure 5:
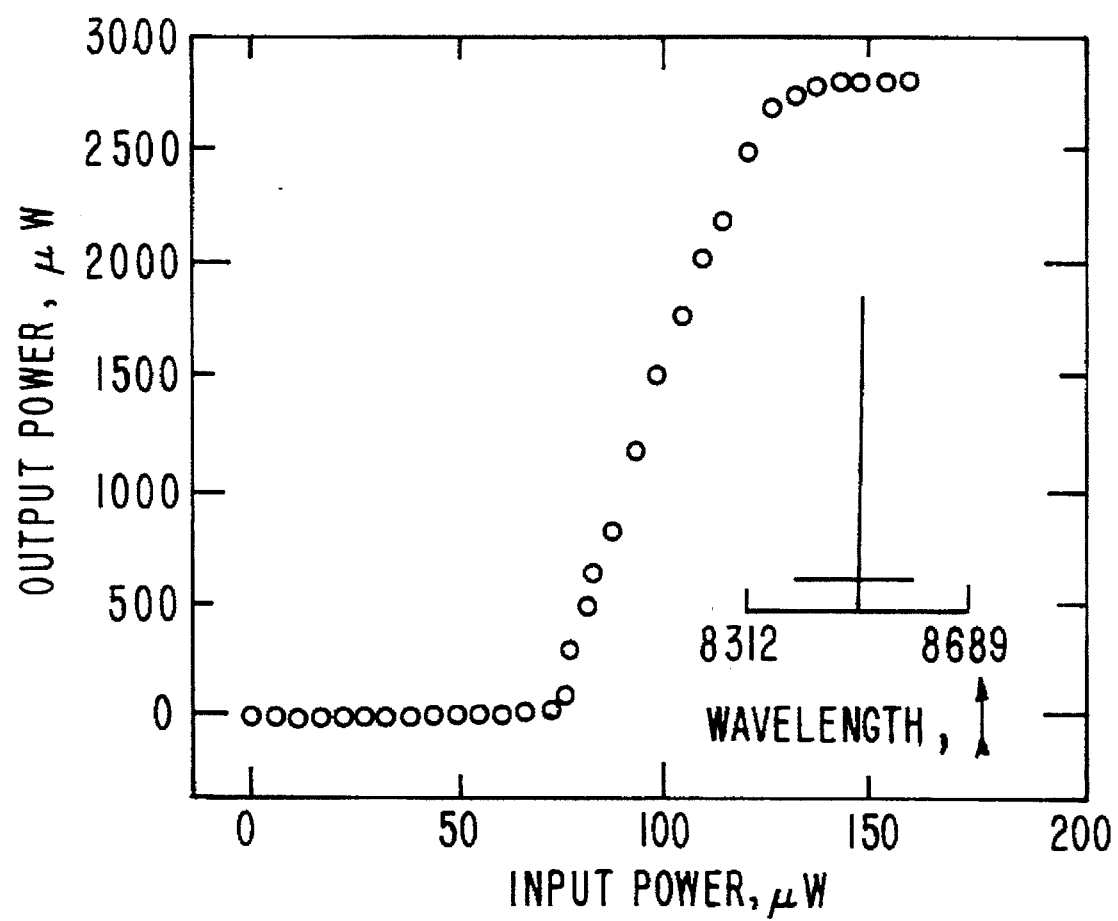
FIG. 5 is a plot of the room-temperature continuous wave output-power of the vertical cavity surface emitting laser versus absorbed input-power of a integrated device.

In FIG. 5, the vertical cavity surface emitting laser output power is given as a function of the input power to the heterojunction phototransistor. The heterojunction phototransistor and the vertical cavity surface emitting laser are connected in series as shown in FIG. 4 with the heterojunction phototransistor in the floating-base configuration and the supply voltage is 8.0 V. The input and output wavelengths are 800 and 850 nanometers, respectively. The input diameter or the heterojunction phototransistor is 15 µm and the output diameter of the vertical cavity surface emitting laser is 15 µm. Input power has been corrected for reflection loss at the air/GaAs interface. The insert shows a typical spectrum of the vertical cavity surface emitting laser near threshold. These transfer characteristics can be modified by adjusting the supply voltage. The integrated device has both high overall optical gain, >20 at peak, and high differential optical gain, >200 at peak. The threshold switching power for the device is 40 µW absorbed input power and unity gain occurs at 75 µW absorbed input power. The output power from the integrated device saturated at 2800 µW for input powers greater than 140 µW. The on (above threshold) / off (below threshold) contrast of the device is 2780, 40 µW absorbed input produced 0.9 µW output and 120 µW absorbed input produced 2500 µoutput).

Such an integrated optoelectronic device as described herein has a myriad of applications depending upon the optical and electrical characteristics of the individual components. One such optical characteristic that can tailored is wavelength.

The sensitivity of the device to particular input wavelengths is determined by the choice of materials for the emitter base and collector regions of the phototransistor. The wavelength of light emitted from the cavity can be adjusted to fall inside or outside the wavelength range over which the optically interactive component is sensitive. On the other hand, the wavelength of the light emitted can vary by changing the relative compositions and thicknesses of the compounds within the layers of the cavity, thereby changing the optical bandgap of the laser active region. Specifically, referring to the preferred embodiment of the invention integrating a heterojunction phototransistor and the vertical cavity surface emitting laser, wavelength up/down conversion and cascadability was demonstrated by converting 680–850 nm input light to 850 nm output light and 850–870 nm input light to 850 nm output light. Furthermore, by increasing the Al composition in the emitter and using InGaAs in the collector, base and quantum-well regions of the vertical cavity surface emitting laser, the wavelength conversion range can be significantly expanded. It is important for cascadability that the bandgap of the base and collector of the heterojunction phototransistor be lower than that of the active material of the laser. For example, an InGaAs vertical cavity surface emitting laser integrated with an AlGaAs/GaAs heterojunction phototransistor is not cascadable and therefore considerably less desirable.

In general, then, when the optical interactive component of the device is a photodetector that provides an input to the vertical cavity surface emitting laser, which in turn provides an optical output, it may be desirable to have the λ entering the photodetector different from the λ of light output from the vertical cavity surface emitting laser. Further, the integrated device provides a huge advantage over all other optical switches, such as nonlinear etalons, in that a large range of input wavelengths produce constant output characteristics of the device. Alternatively, in an optical computing application wherein one device of the invention or one array of devices of the invention drives a similar but separate device or array, it would be desirable for the input light and the output light to have the same λ. This enables cascadability.

Figure 6:
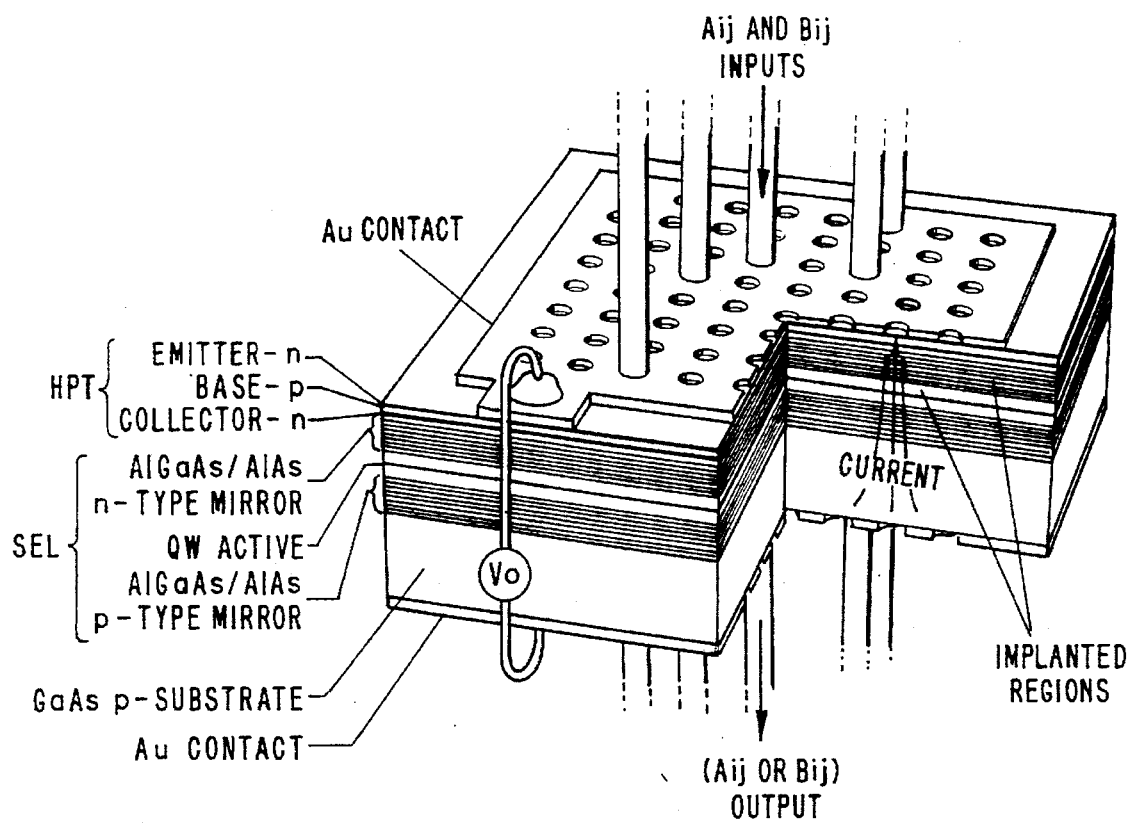
FIG. 6 illustrates the placement of the individual integrated devices into an optical integrated electron is circuit.

FIG. 6 illustrates yet another application or embodiment of the invention which may be, for example, an element in a cascadable array. Light is received through either a refractive lenslet 200 or through a GaAs substrate 202 transparent to the wavelength of the light. In certain applications input light may be transmitted through both the lenslet 200 and the substrate 202. In one embodiment the light is focused onto or received by a dector 204 electrically connected to the substrate 202 with ohmic contacts 206. The detector 204 in response to the input generates and may even amplify an electrical signal which serves an input into a GaAs integrated circuit 210. The GaAs electronic integrated circuit 210 may then perform functions typical of integrated circuits, e.g., switching, routing, computing, etc. The electrical signal output from the integrated cir into the electro- or photo-sensitive interactive element 214. Note that the interactive element 214 may also be sensitive to light, but in any event, the interactive element 214 provides the necessary input to the vertical cavity surface emitting laser 216. The vertical cavity surface emitting laser 216 is biased through ohmic contact 218 and laser anode contact 220. An optical output through refractive lenslet 222 may then be received by yet another detector 204 or another electro- or photo-sensitive interactive element 214 in an array. The wavelengths given here are illustrative only, but it is to be noted that in order for the GaAs substrate to be transparent to the light, the wavelength should be greater than 950 nm; and in order to achieve practicable cascadability between arrays, the detector 204 and/or interactive component 214 must be sensitive to the wavelength output from the vertical cavity surface emitting laser 216. The sequence of events described with respect to FIG. 6 need not be limited however to the current or signal flow from the detector 204 to the interactive element 214, or as illustrated from the left to the right. Light may be received through the interactive element 214 thereby causing the signal to flow through the integrated circuit 210 and in turn to the detector 204 and onto to yet another element in the array, or from the right to the left as illustrated in FIG. 6.

A second optical characteristic which can b light output. Control of polarization can be realized by varying the shape of the particular laser emitter, such as into an ellipsoidal or elongated orientation along a specified crystal axis of the substrate. Polarization will also be affected by changing the orientation of the device with respect to the crystal orientation of the individual layers. Practicably, however, the photodetector itself is difficult to control with respect to polarization, therefore the use of polarizing films or polarizing layers can facilitate the manipulation of the optical polarization characteristics.

The coherency of the light output is yet another optical characteristic that can be manipulated. It is extremely useful for individual devices to be mutually coherent if used in an array for applications such as beam steering or image processing.

Different applications are further enabled if the emitted light and the detected light come from or go into the device of the invention at the same surface than if the emitted light emerges from a different surface than the surface into which the light enters the device. In both cases, however, it is contemplated that the emitted light is parallel to the detected light. A further variation of this particular application occurs if the λs or any other optical characteristic of the emitted and the detected light differ.

At least one electrical characteristic of the device which can be controlled and result in different applications is the power input to the device. The power of the device is either a function of the bias voltage applied or is a function of the size of the device. For example, neural network application require lower power than visual display applications.

Another electrical feature to be controlled is dependent upon the connection between the optical interactive component and the vertical cavity surface emitting laser. The preferred embodiment is a heterojunction phototransistor in series connection with the vertical cavity surface emitting laser. The serial connection permits a compact vertical geometry and low power requirements because of the direction of electron flow between the heterojunction phototransistor and the vertical cavity surface emitting laser.

Alternatively, however, parallel electrical connection between the optical interactive component and the vertical cavity surface emitting laser can facilitate certain optical logic functions. For instance, for optical interactive components such as photodetectors combined appropriately with vertical cavity surface emitting lasers, an optical inverter results from light entering the photodetectors that turn off any emitted light providing the device has no latching. Parallel connections, of course, imply a side-by-side or adjacent positioning between the interactive component and the vertical cavity surface emitting laser. Parallel connections can also be accomplished in a vertical geometry by making an electrical connection between the components.

Controlling the optical and electrical feedback between the vertical cavity surface emitting laser and the interactive component may be used to alter the properties of the device, for example, causing it to have a latching or memory state or exhibit variable hysteresis in the output signal as a function of the input signal, which cannot be provided for by photothyristors. One way to control the optical feedback within the vertical cavity surface emitting laser is to design the mirrors within the laser to have specific reflectivities to obtain optical hysteresis or latching capabilities. The slope of the light-output versus light-input curve can be modified to be either binary-like for digital functions or sigmoidal-like for neural functions, or optically bistable for optical memory applications. Additionally, an absorbing layer can be placed between the vertical cavity surface emitting laser and the optically sensitive interactive component. To minimize optical feedback when the interactive component is a phototransistor, the two optical devices may be made to be sensitive to different wavelengths or by placing the vertical cavity surface emitting laser and the phototransistor side-by-side. Electrical feedback is controlled by a semiconductor layer between the vertical cavity surface emitting laser and the interactive component to prevent minority carder transport. In an array, complete electronic isolation between the individual devices controls electrical feedback between separate devices. Advantages realized by these structural features of the invention is that the device may be turned on or off with only optical signals, rather than reversing or stopping the flow of current, thereby facilitating optical computing. Because the device can be designed to have no latching, the device has faster response time because it does not have to overcome excessive positive feedback when switching off. Latching of the preferred embodiment of the integrated device was achieved by directing a fraction of the vertical cavity surface emitting laser output power at 850 nm onto the heterojunction phototransistor and then blocking the 800 nm input to the heterojunction phototransistor.

Arrays using these devices can also be configured as latching devices by allowing optical feedback from the vertical cavity surface-emitting lair to be absorbed in the base/collector regions of the heterojunction phototransistor or by replacing the heterojunction phototransistor by a thyristor in which case they would function as image memories capable of capturing and storing a two-dimensional image until the array is reset.

And, because of the low-input powers required to switch the devices, the integrated devices are well matched for integration with N×N arrays of individually addressable electroabsorption modulators that are only able to modulate low-power input beams.

Since both the input and output optical beams are out of plane, these devices are ideally suited to have two-dimensional Fourier transformations performed by them using simple lenses thus giving them a natural advantage in the areas of pattern recognition and image correlation.

Electrical components, e.g., resistors, capacitors, inductors, diodes, or other active devices, may be placed in series or parallel with the photodetector, amplifier, photoemitter, or combination of components. Also, other optical components, e.g., filters, mirrors, lenses, polarizers, Fabry-Perot cavities, absorbers, and nonlinear elements may be combined with the photodetector and photoemitter. Additional series electrical and optical components may be made by including additional layers between those for the major components. Additional parallel components might best be implemented by changing the properties of the perimeter of the device since this would not require defining separate components outside the device.

Single devices are formed from the adjacent layers for particular components by making the material surrounding the device electrically insulating. These integrated devices can be operated as optical switching, optical bistable, or light amplification devices. These devices perform Boolean algebraic functions such as AND, OR using two beam combinations or as XOR by combining these devices and heterojunction phototransistors and as such, may be configured as binary adders using optical symbolic substitution and cross-bar switches. Cascadable optical logic (AND-, OR- and exclusive OR-gates) applications have been achieved using the integrated heterojunction phototransistors and vertical cavity surface emitting lasers. The optical Boolean logic operations use simple combinations of high-gain AlGaAs/GaAs n-p-n phototransistors and low threshold AlGaAs/GaAs vertical cavity surface emitting lasers.

Figure 7:
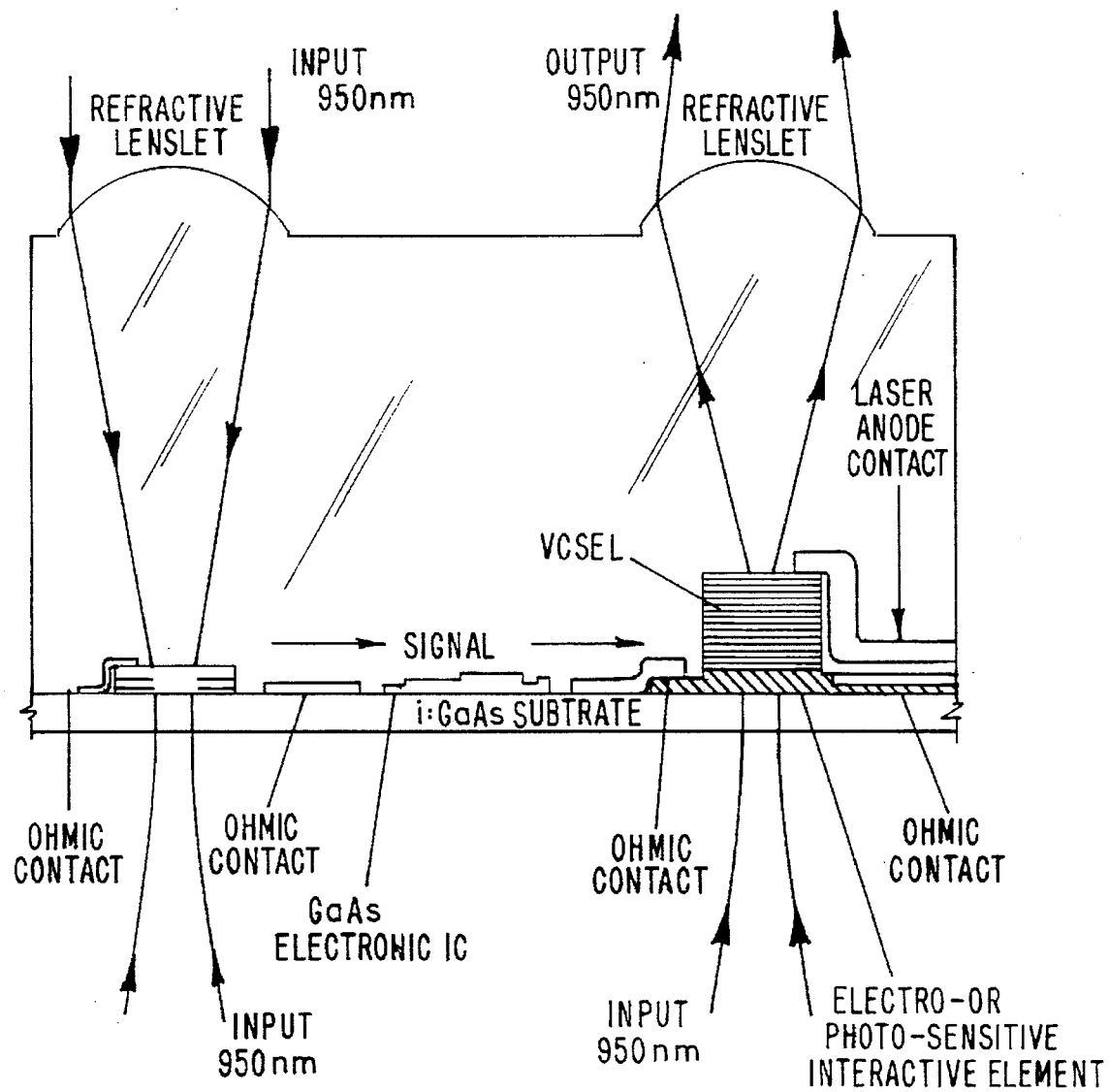
FIG. 7 illustrates the placement of individual integrated devices into a two dimensional array.

One and two-dimensional arrays of devices are made by making the material between devices insulating. This insulating region can be fabricated using ion implantation to damage the crystal lattice. Alternatively, dry or wet etching can be used in this region, thereby leaving air as an insulator; in this case, dry etching is preferred because it is capable of sharply defining these insulating regions. As can be seen more clearly in FIG. 7, the devices are arranged vertically into a two-dimensional array. Vertical arrangement is an important feature achieved by the device 100 and means that the components associated with one device 100 in the array 200 are adjacently positioned along a line perpendicular to the plane of the two-dimensional array 200. This vertical arrangement attains minimal size for the device 100 determined by the size of the largest component rather than the combined sizes of the separate components. For examples, devices may be defined or patterned having 1–50 µm diameters and spaced a few to tens of microns, center-to-center, allowing, for example, 1000×1000 elements with a few square millimeters. Since the components are physically adjacent, no additional materials are required to electrically interconnect the components in a serial fashion, further reducing the device size and fabrication complexity. The devices are easily fabricated into high-density, two dimensional arrays. Because both the input and output images are directed perpendicular to the arrays, the devices are extremely useful for parallel signal processing, multichannel interconnections, neural networks and visual displays.

If arranged in an array, electrical power may easily be applied to the array through two planar conducting layers placed at each end of the device. If necessary, sections of the conducting layers may be removed to allow optical signals to pass through them. The entire array may be powered by connecting the two conducting layers to a source of electrical power. Because electrical power is supplied to the device through the ends, the electrical current generally flows vertically, i.e., through the component layers rather than along them. Thus, the components should be compatible with vertical current flow.

The devices of the invention configured into arrays have optoelectronic applications including parallel signal processing, multichannel interconnections, neural networks visual displays, image amplifiers, pattern recognition, and two-dimensional out-of-plane optical processing. Using a holographic optical element, a global configuration of an optical neural network in which the integrated devices perform optical neuron functions. Thus, the arrays may serve as a massively parallel interconnected neural network and be taught to discriminate between similar optical input. These arrays can also convert images from one wavelength to another or from incoherent to coherent lights. One skilled in the art, moreover, will also appreciate that arrays of these devices can also be configured as latching devices, in which case they can function as switching arrays for optical symbolic substitution or as image memories capable of capturing, storing and displaying a two-dimensional image until arrays are reset.

What is claimed is:

1. An optoelectronic device, comprising:
    (a) a vertical cavity surface emitting laser comprising a first mirror, a second mirror, both of said mirrors defining the extent of said laser; and a laser cavity interposed between said mirrors; and
    (b) an opto- and/or electronic interactive component, said interactive component and said laser monolithically integrated and electrically connected in parallel, wherein said interactive component provides an electronic output which serves as an input into said vertical cavity surface emitting laser.

2. An optoelectronic device as in claim 1, wherein said interactive component and said vertical cavity surface emitting laser are displaced horizontally with respect to each other.

3. An optoelectronic device as in claim 1, wherein an integrated optically absorbing layer is interposed between said active component and said vertical cavity surface emitting laser.

4. An optoelectronic device as in claim 2, wherein said interactive component and said vertical cavity surface emitting laser are contiguous.

5. An optoelectronic device as in claim 2, wherein an integrated optically absorbing layer is interposed between said interactive component and said vertical cavity surface emitting laser.

6. An optoelectronic device as in claim 2, wherein a layer selective with respect to electronic carrier type is interposed between said interactive component and said vertical cavity surface emitting laser.

7. An optoelectronic device as in claim 1, wherein said interactive component and said vertical cavity surface emitting laser are arranged in a vertical geometry.

8. An optoelectronic device as in claim 1, wherein said interactive component and said vertical cavity surface emitting laser are displaced horizontally with respect to each other.

9. An optoelectronic device as in claim 7, wherein said interactive component and said vertical cavity surface emitting laser are contiguous.

10. An optoelectronic device as in claim 7, wherein an integrated optically absorbing layer is interposed between said interactive component and said vertical cavity surface emitting laser.

11. An optoelectronic device as in claim 7, wherein a layer selective with respect to electronic carrier type is interposed between said interactive component and said vertical cavity surface emitting laser.

12. An optoelectronic device as in claim 7, wherein said interactive component and said vertical cavity surface emitting laser are contiguous.

13. An optoelectronic device as in claim 7, wherein an integrated optically absorbing layer is interposed between said interactive component and said vertical cavity surface emitting laser.

14. An optoelectronic device as in claim 7, wherein a layer selective with respect to electronic carrier type is interposed between said interactive component and said vertical cavity surface emitting laser.

15. An optoelectronic device, comprising:
   (a) a vertical cavity surface emitting laser comprising a first mirror, a second mirror, said mirrors defining the extent of said laser with a laser cavity interposed between said mirrors; and
   (b) an opto- and/or electronic interactive component, said vertical cavity surface emitting laser and said interactive component monolithically integrated and electrically connected in series, wherein said laser provides an optical output which serves as an input into said interactive component.

16. An optoelectronic device as in claim 15, wherein said interactive component and said vertical cavity surface emitting laser are arranged in a vertical geometry.

17. An optoelectronic device as in claim 15, wherein said interactive component and said vertical cavity surface emitting laser are displaced horizontally with respect to each other.

18. An optoelectronic device as in claim 16, wherein said interactive component and said vertical cavity surface emitting laser are contiguous.

19. An optoelectronic device as in claim 16, wherein an integrated optically absorbing layer is interposed between said interactive component and said vertical cavity surface emitting laser.

20. An optoelectronic device as in claim 16, wherein a layer selective with respect to electronic carrier type is interposed between said interactive component and said vertical cavity surface emitting laser.

21. An optoelectronic device as in claim 17, wherein said interactive component and said vertical cavity surface emitting laser are contiguous.

22. An optoelectronic device as in claim 17, wherein an integrated optically absorbing layer is interposed between said interactive component and said vertical cavity surface emitting laser.

23. An optoelectronic device as in claim 17, wherein a layer selective with respect to electronic carrier type is interposed between said interactive component and said vertical cavity surface emitting laser.

24. An optoelectronic device, comprising:
   (a) a vertical cavity surface emitting laser comprising a first mirror, a second mirror, said mirrors defining the extent of said laser with a laser cavity interposed between said mirrors; and
   (b) an opto- and/or electronic interactive component, said vertical cavity surface emitting laser and said interactive component monolithically integrated and electrically connected in parallel, wherein said laser provides an optical output which serves as an input into said interactive component.

25. An optoelectronic device as in claim 24, wherein said interactive component and said vertical cavity surface emitting laser are arranged in a vertical geometry.

26. An optoelectronic device as in claim 24, wherein said interactive component and said vertical cavity surface emitting laser are displaced horizontally with respect to each other.

27. An optoelectronic device as in claim 25, wherein said interactive component and said vertical cavity surface emitting laser are contiguous.

28. An optoelectronic device as in claim 25, wherein an integrated optically absorbing layer is interposed between said interactive component and said vertical cavity surface emitting laser.

29. An optoelectronic device as in claim 25, wherein a layer selective with respect to electronic carrier type is interposed between said interactive component and said vertical cavity surface emitting laser.

30. An optoelectronic device as in claim 26, wherein said interactive component and said vertical cavity surface emitting laser are contiguous.

31. An optoelectronic device as in claim 26, wherein an integrated optically absorbing layer is interposed between said interactive component and said vertical cavity surface emitting laser.

32. An optoelectronic device as in claim 26, wherein a layer selective with respect to electronic carrier type is interposed between said interactive component and said vertical cavity surface emitting laser.

33. An integrated optoelectronic device, comprising:
   (a) means to receive an optical input and convert said optical input into an electronic signal; and
   (b) a vertical cavity surface emitting laser to receive said electrical signal and in response thereto generate an optical output, said receiving and converting means and said vertical cavity surface emitting laser monolithically integrated as said optoelectronic device, wherein said receiving and converting means and said vertical cavity surface emitting laser are electrically connected in parallel.

34. The optoelectronic device of claim 33, wherein said receiving and converting means in a heterojunction phototransistor.

35. The optoelectronic device of claim 33, wherein said receiving and converting means is an avalanche photodiode.

36. The optoelectronic device of claim 33, wherein said receiving and converting means is a is a photothysristor.

37. The optoelectronic device of claim 33, wherein said receiving and converting means is a photodiode and said device further comprises an amplifying means electrically interposed between said photodiode and said vertical cavity surface emitting laser.

38. An optoelectronic device of claim 33, wherein a portion of said optical output of said vertical cavity surface emitting laser is a portion of said optical input into said receiving and converting means to provide for optical feedback.

39. An integrated optoelectronic device, comprising:
   (a) means to receive an electrical input signal and amplify said signal to generate more electronic carriers in response thereto; and
   (b) a vertical cavity surface emitting laser to receive said electronic carriers and in response thereto to generate an optical output, said receiving and generating means and said vertical cavity surface emitting laser electrically connected in series and monolithically integrated as said optoelectronic device.

40. The optoelectronic device as in claim 39, further comprising:
   (a) a plurality of said optoelectronic devices of claim 39 in a planar configuration, said devices separated by electrical and optical isolating means.

41. An optoelectronic device of claim 39, further comprising a feedback means to provide for electronic feedback between said vertical cavity surface emitting laser and said electrical receiving and generating means.

42. An integrated optoelectronic device, comprising:

(a) means to receive an electrical input signal and amplify said signal to generate more electronic carriers in response thereto; and (b) a vertical cavity surface emitting laser to receive said electronic carriers and in response thereto to generate an optical output, said receiving and generating means and said vertical cavity surface emitting laser electrically connected in parallel and monolithically integrated as said optoelectronic device.

43. The optoelectronic device of claim 39 or 42, wherein said electrical receiving and generating means is a transistor.

44. The optoelectronic device of claim 43, wherein said transistor is a field-effect transistor.

45. The optoelectronic device of claim 43, wherein said transistor is a bipolar transistor.

46. The optoelectronic device of claim 39 or 42, wherein said device further comprises an amplifying means electrically interposed between said electrical receiving and generating means and said vertical cavity surface emitting laser.

47. The optoelectronic device as in claim 42, further comprising a plurality of said optoelectronic devices of claim 42 in a planar configuration, said devices separated by electrical and optical isolating means.

48. An optoelectronic device of claim 42, further comprising a feedback means to provide for electronic feedback between said vertical cavity surface emitting laser and said electrical receiving and generating means.

49. An integrated optoelectronic device, comprising:

(a) a vertical cavity surface emitting laser to provide an optical output in response to a threshold electronic stimulus; and (b) means to receive said optical output from said vertical cavity surface emitting laser and to generate a second optical signal in response thereto, said vertical cavity surface emitting laser and said optical receiving means monolithically integrated as said optoelectronic device.

50. The optoelectronic device as in claim 49, further comprising:

(a) a plurality of said optoelectronic devices of claim 49 in a planar configuration, said devices separated by electrical and optical isolating means.

51. An optoelectronic device of claim 49, further comprising a feedback means to provide a portion of said second optical signal to said vertical cavity surface emitting laser as an electronic signal to provide for optoelectronic feedback.

52. An integrated optoelectronic device, comprising:

(a) a vertical cavity surface emitting laser to provide an optical output in response to a threshold electronic stimulus; and (b) means to receive said optical output from said vertical cavity surface emitting laser and to generate and amplify an output electrical signal in response thereto, said vertical cavity surface emitting laser and said optical receiving means monolithically integrated as said optoelectronic device.

53. The optoelectronic device of claim 52, wherein said optical receiving means is a heterojunction phototransistor.

54. The optoelectronic device of claim 52, wherein said optical receiving means is an avalanche photodiode.

55. The optoelectronic device of claim 52, wherein said optical receiving means is a photothyristor.

56. The optoelectronic device as in claim 52, further comprising:

(a) a plurality of said optoelectronic devices of claim 52 in a planar configuration, said devices separated by electrical and optical isolating means.

57. An optoelectronic array, as in claims 40, 50, 56, or 47, wherein said array is configured in a 1×N, wherein N represents the number of said devices and N is an integer greater than one.

58. An optoelectronic array, as in claims 40, 50, 56 or 47, wherein said array is configured in a 1×N, wherein N represents the number of said devices as H is an integer greater than one.

59. An optoelectronic device of claim 52, wherein a portion of said output electrical signal from said vertical cavity surface emitting laser augments said electronic stimulus.

60. A cascadable integrated optoelectronic device, comprising:

(a) a semiconductor optical receiving means to receive an optical input having a specified wavelength and convert said optical input into an electronic signal; and (b) a vertical cavity surface emitting laser to receive said electrical signal and in response thereto generate an optical output having substantially said specified wavelength, said optical receiving means and said vertical cavity surface emitting laser monolithically integrated as said cascadable optoelectronic device.

* * * * *